US012575262B2

(12) United States Patent
Chen et al.

(10) Patent No.: US 12,575,262 B2
(45) Date of Patent: Mar. 10, 2026

(54) BEZEL-LESS CAMERA AND SENSOR HOLE

(71) Applicant: Applied Materials, Inc., Santa Clara, CA (US)

(72) Inventors: Chung-chia Chen, Hsinchu City (TW); Jungmin Lee, Santa Clara, CA (US); Yu-hsin Lin, Zhubei City (TW); Ji Young Choung, Hwaseong-si (KR); Wen-Hao Wu, San Jose, CA (US); Dieter Haas, Santa Clara, CA (US); Si Kyoung Kim, Gwangju-si (KR)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 18/363,574

(22) Filed: Aug. 1, 2023

(65) Prior Publication Data

US 2024/0040831 A1     Feb. 1, 2024

Related U.S. Application Data

(60) Provisional application No. 63/429,427, filed on Dec. 1, 2022, provisional application No. 63/374,997, filed (Continued)

(51) Int. Cl.
*H10K 59/121*     (2023.01)
*H10K 59/12*     (2023.01)
*H10K 59/65*     (2023.01)

(52) U.S. Cl.
CPC ....... *H10K 59/121* (2023.02); *H10K 59/1201* (2023.02); *H10K 59/65* (2023.02)

(58) Field of Classification Search
CPC ... H10K 59/121; H10K 59/1201; H10K 59/65

(Continued)

(56) References Cited

U.S. PATENT DOCUMENTS

| 11,348,983 B1 * | 5/2022 | Choung | ........... H10K 59/80522 |
| 11,527,732 B1 * | 12/2022 | Chen | ...................... H10K 30/82 |

(Continued)

FOREIGN PATENT DOCUMENTS

| KR | 2006-0060461 A | 6/2006 |
| WO | 2022039890 A1 | 2/2022 |

OTHER PUBLICATIONS

PCT Notification of Transmittal of the International Search Report and the Written Opinion of the International Searching Authority for International Application No. PCT/US2023/029244; dated Nov. 24, 2023.

(Continued)

*Primary Examiner* — Christopher M Raabe
(74) *Attorney, Agent, or Firm* — Patterson + Sheridan, LLP

(57)     ABSTRACT

Embodiments described herein relate to sub-pixel circuits, displays including sub-pixel circuits, and a method of forming sub-pixel circuits that may be utilized in a display such as an organic light-emitting diode (OLED) display. Some configurations of the displays described herein, include the sub-pixel circuits and at least one sensor opening adjacent to the overhang structure and an adjacent sub-pixel circuit. The at least one sensor opening includes a sensor disposed thereunder. Other configurations displays described herein, include sub-pixel circuits including OLED sub-pixels and a transparent sub-pixel such that a sensor is disposed thereunder. The configurations described herein utilize sensors that are integrated to increase the transmittance of the display while eliminating the need for bezels and reducing dead zones in the display.

30 Claims, 15 Drawing Sheets

Related U.S. Application Data on Sep. 8, 2022, provisional application No. 63/370,
007, filed on Aug. 1, 2022.

(58) Field of Classification Search
 USPC ................................................. 313/498–512
 See application file for complete search history.

(56) References Cited

U.S. PATENT DOCUMENTS

| | | | |
|---|---|---|---|
| 11,552,143 | B1 | 1/2023 | Choung et al. |
| 2017/0200428 | A1* | 7/2017 | Song ........................ G09G 5/02 |
| 2020/0365667 | A1 | 11/2020 | Jo et al. |
| 2021/0135150 | A1* | 5/2021 | Wang ..................... H10K 71/40 |
| 2021/0384270 | A1 | 12/2021 | Liu et al. |
| 2022/0102448 | A1* | 3/2022 | Liu ...................... H10K 59/879 |
| 2022/0344417 | A1* | 10/2022 | Choung ........... H10K 59/80522 |
| 2025/0063899 | A1* | 2/2025 | Yao ...................... H10K 59/122 |
| 2025/0169326 | A1* | 5/2025 | Chen ................. H10K 59/1201 |

OTHER PUBLICATIONS

Korean Office Action for Application No. 10-2025-7006927 dated
Nov. 10, 2025.

\* cited by examiner

400

BEZEL-LESS CAMERA AND SENSOR HOLE

RELATED APPLICATIONS

This application claims benefit of and priority to U.S. Application No. 63/429,427, filed Dec. 1, 2022, U.S. Application No. 63/374,997, filed Sep. 8, 2022, and U.S. Application No. 63/370,007, filed Aug. 1, 2022, which are herein incorporated in their entirety by reference for all purposes.

BACKGROUND

Field

Embodiments described herein generally relate to a display. More specifically, embodiments described herein relate to sub-pixel circuits, displays including sub-pixel circuits, and methods of forming sub-pixel circuits that may be utilized in a display such as an organic light-emitting diode (OLED) display

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art sub-pixel circuits, displays including sub-pixel circuits, and methods of forming sub-pixel circuits that may be utilized in a display such as an OLED display.

SUMMARY

In one embodiment, a display is provided. The display includes a backplane, a plurality of sub-pixel circuits separated by an overhang grid disposed over the backplane, each sub-pixel circuit having sub-pixels surrounded by overhang structures of the overhang grid, each sub-pixel having an anode connected to a thin film transistor (TFT) of the backplane, and an organic light-emitting diode (OLED) material disposed over the anode, and a sensor opening. Sub-pixel circuits surround the sensor opening and are separated from the sensor opening by the overhang grid. The sensor opening is surrounded by a respective overhang structure. A sensor is disposed under the sensor opening either in or under the backplane.

In another embodiment, a display is provided. The display includes a backplane, a plurality of sub-pixel circuits separated by an overhang grid disposed over the backplane, each sub-pixel circuit having sub-pixels surrounded by overhang structures of the overhang grid; each sub-pixel having: an anode connected to a TFT of the backplane, and an OLED material disposed over the anode, and a plurality of sensor arrays, exterior sensor arrays of the plurality of sensor arrays are adjacent to and separated from the sub-pixel circuits by the overhang grid, each sensor array having sub-pixel openings surrounded by overhang structures of the overhang grid. A sensor is disposed under the plurality of sensor arrays either in or under the backplane.

In another embodiment, a sub-pixel circuit is provided. The sub-pixel circuit includes a backplane, an overhang grid disposed on the backplane, the overhang grid defining an OLED sub-pixel and a transparent sub-pixel, each of the OLED sub-pixel and the transparent sub-pixel are surrounded by overhang structures of the overhang grid. The OLED sub-pixel has an anode connected to a thin film transistor (TFT) of the backplane and an OLED material disposed over the anode.

In another embodiment, a method is provided. The method includes depositing an organic light emitting diode (OLED) material over a backplane, the an overhang grid defines a sub-pixel area and a transparent area, disposing a cathode over the OLED material over the sub-pixel area and the transparent area, depositing an encapsulation layer over the backplane, forming a resist layer in the sub-pixel area of the backplane, removing one or more exposed portions of the encapsulation layer, removing one or more exposed portions of the OLED material, and removing the resist layer.

In yet another embodiment, a device is provided. The device includes a backplane, and a plurality of overhang structures, adjacent overhang structures of the plurality of overhang structures define at least one sub-pixel and at least one transparent area, the device is made by a process including the steps of depositing an OLED material over the backplane, the OLED material is disposed over an anode of the at least one sub-pixel, and depositing a cathode, the cathode disposed over the OLED material of at least one sub-pixel, wherein a sensor or an emitter of the at least one transparent area is operable to receive or project light through the backplane and the transparent area.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a display. More specifically, embodiments described herein relate to sub-pixel circuits, displays including sub-pixel circuits, and a method of forming sub-pixel circuits that may be utilized in a display such as an organic light-emitting diode (OLED) display. Some configurations of the displays described herein, include the sub-pixel circuits and at least one sensor opening adjacent to the overhang structure and an adjacent sub-pixel circuit. The at least one sensor opening includes a sensor disposed thereunder. Other configurations displays described herein, include sub-pixel circuits including OLED sub-pixels and a transparent sub-pixel such that a sensor is disposed thereunder. The configurations described herein utilize sensors that are integrated to increase the transmittance of the display while eliminating the need for bezels and reducing dead zones in the display.

Figure 1A:
FIG. 1A is a schematic, top sectional view of a display having an opening configuration according to embodiments.
Figures 2A, 2B:
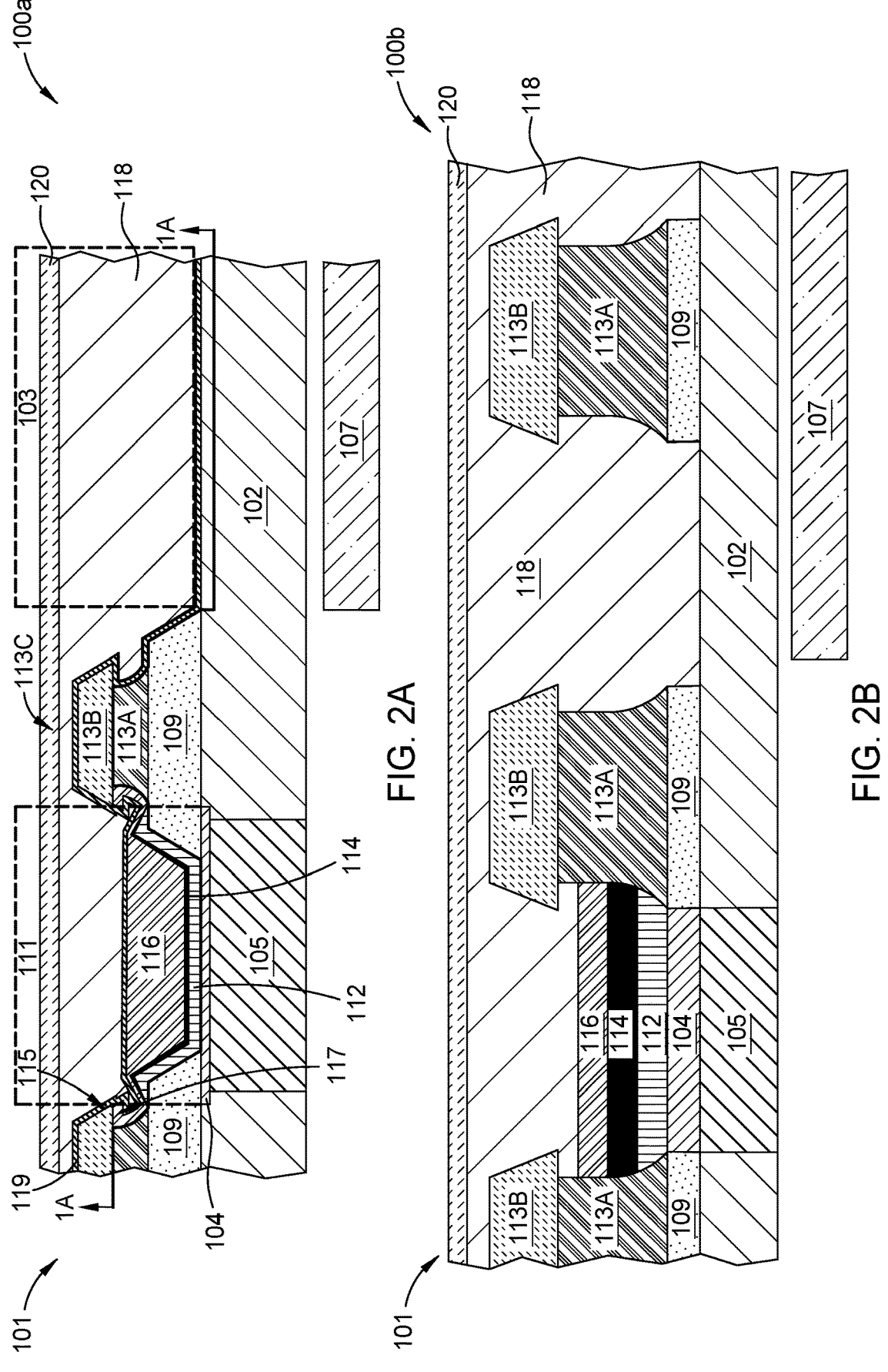
FIG. 2A is a schematic, cross-sectional view of a sub-pixel circuit and a sensor opening according to embodiments.
FIG. 2B is a schematic, cross-sectional view of a sub-pixel circuit and a portion of a sensor array according to embodiments.
Figures 2C, 2D:
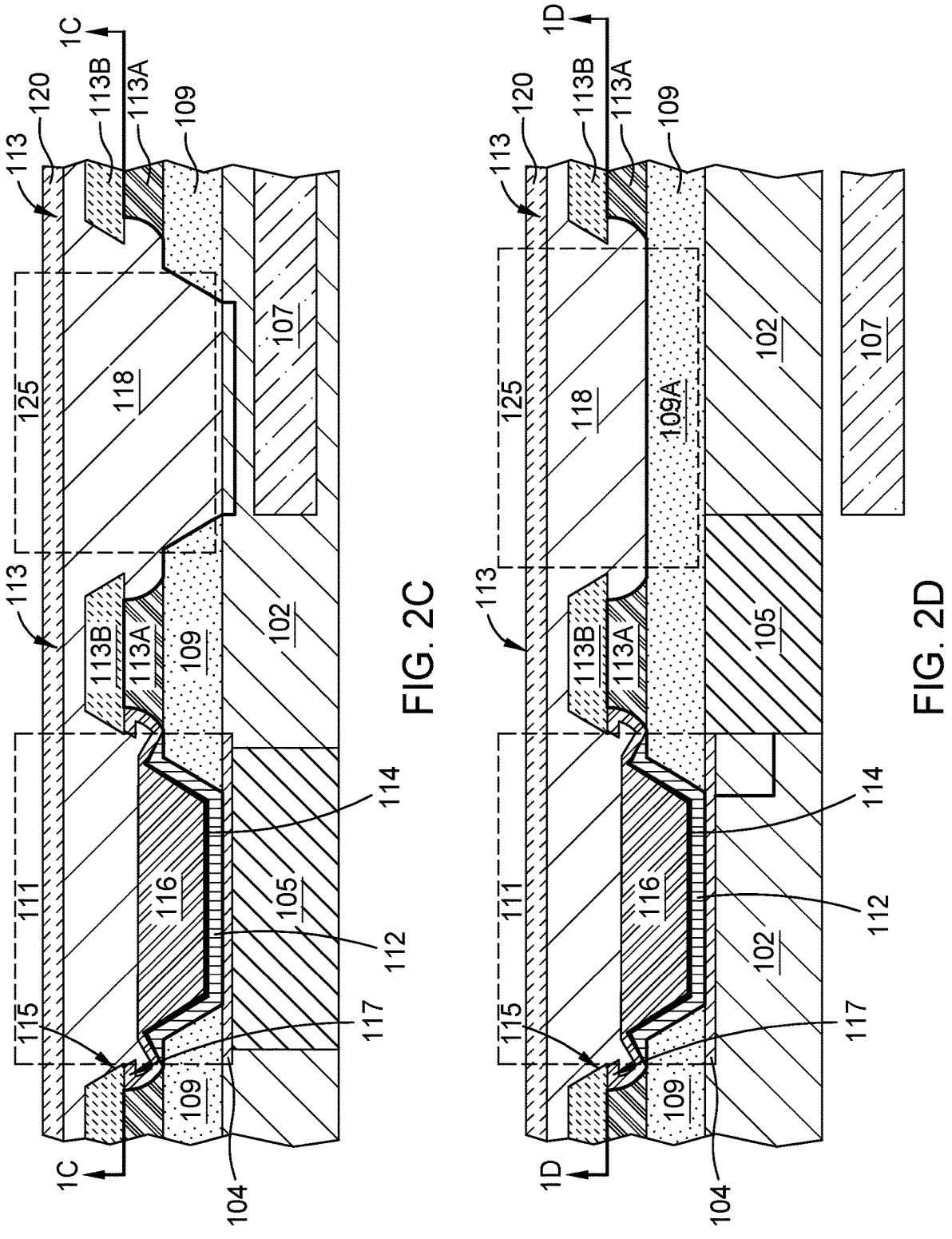
FIGS. 2C and 2D are schematic, cross-sectional views of a sub-pixel circuit according to embodiments.

FIG. 1A is a schematic, top sectional view of a display 100 having an opening configuration 100A. FIG. 2A is a schematic, cross-sectional view of a sub-pixel circuit 101 and a sensor opening 103 of the opening configuration 100A. The display 100 of the opening configuration 100A includes a plurality sub-pixel circuits 101 and at least one sensor opening 103. The display 100 includes a backplane 102. The backplane 102 includes a plurality of thin film transistors (TFT) 105. At least one sensor 107 is disposed below backplane 102, as shown in FIG. 2A, or in the backplane 102 as shown in FIG. 2C. The sensor 107 is a complementary metal oxide semiconductor (CMOS), a charge coupled device (CCD), metasurface, photodiode, solar cell emitter, or combination thereof. The emitter may be an IR emitter, LED, or other emitter.

Anodes 104 may be patterned on the backplane 102 and are defined by adjacent pixel-defining layer (PDL) structures 109 disposed on the backplane 102. Some embodiments of the displays 100 of this disclosure have other structures defining the anodes 104 and PDL structures 109 are not utilized. In some embodiments, which can be combined with other disclosures described herein, as shown in FIG. 2B, the PDL structures 109 disposed on the backplane 102. The anodes 104 are disposed on the backplane 102 between the PDL structures 109. The anodes 104 and the PDL structures 109 have the same height as shown in FIG. 2B. The configuration of the anodes 104 and the PDL structures 109 of FIG. 2B is applicable to other embodiments described herein.

In one embodiment, the metal-containing layers are pre-patterned on the backplane 102. E.g., the backplane 102 is a pre-patterned indium tin oxide (ITO) glass substrate. The metal-containing layers are configured to operate anodes 104 of respective sub-pixels. The anodes 104 include, but are not limited to, chromium, titanium, gold, silver, copper, aluminum, ITO, combinations thereof, or other suitably conductive materials. The anodes 104 connected to the TFTs 105 of the backplane 102. In some embodiments, which may be combined with other embodiments described herein, the anodes 104 of the OLED sub-pixels 111 are disposed above, e.g., disposed on, the TFTs 105. In other embodiments, as shown in FIG. 2D, the anodes 104 are connected to the TFTs 105 of the backplane 102 via wiring.

The display 100 having the opening configuration 100A includes sub-pixel circuits 101 separated by an overhang grid 110. Each sub-pixel circuit 101 has a plurality of OLED sub-pixels 111. The OLED sub-pixels 111 are at least a first OLED sub-pixel 111a, a second OLED sub-pixel 111b, and a third OLED sub-pixel 111c. While the Figures depict the first OLED sub-pixel 111a, the second OLED sub-pixel 111b, and the third OLED sub-pixel 111c, the sub-pixel circuits 111 of the embodiments described herein may include three or more OLED sub-pixels 111, such as a fourth and a fifth sub-pixel. Each OLED sub-pixel 111 has OLED material 112 configured to emit a white, red, green, blue or other color light when energized. E.g., the OLED material 112 of the first OLED sub-pixel 111a emits a green light when energized, the OLED material of the second OLED sub-pixel 111b emits a blue light when energized, the OLED material of a third OLED sub-pixel 111c emits a red light when energized, and the OLED material of a fourth sub-pixel and a fifth sub-pixel emits another color light when energized.

Each OLED sub-pixel 111 is surrounded by overhang structures 113 of the overhang grid 110. In embodiments including PDL structures 109, overhang structures 113 are disposed on an upper surface of each of the PDL structures 109. The overhang structures 113 include at least a second structure 113B disposed over a first structure 113A. Each overhang structure 113 includes an overhang 115. The overhangs 115 is defined by an extension 117 of the second structure 113B extending laterally past a sidewall of the first structure 113A. The second structure 113B includes one of a non-conductive material, inorganic material, or metal-containing material. The first structure 113A includes one of a non-conductive material, inorganic material, or metal-containing material. The non-conductive material includes, but it not limited to, an inorganic silicon-containing material. E.g., the silicon-containing material includes oxides or nitrides of silicon, or combinations thereof. The metal-containing materials include at least one of a metal or metal alloy such as titanium (Ti), aluminum (Al), aluminum neodymium (AlNd), molybdenum (Mo), molybdenum tungsten (MoW), copper (Cu), or combinations thereof.

The inorganic materials of the first structure 113A and the second structure 113B include silicon nitride ($Si_3N_4$), silicon oxide ($SiO_2$), silicon oxynitride ($Si_2N_2O$), or combinations thereof. The overhang structures 110 are able to remain in place, i.e., are permanent. In one embodiment, which may be combined with other embodiments described herein, the first structure 113A includes an inorganic material, such as silicon, e.g. amorphous silicon, and the second structure 113B includes germanium, copper, chromium, gallium arsenide (GaAs), a group III element, a group IV element, a III-V compound semiconductor, or a combination thereof. In another embodiment, which may be combined with other embodiments described herein, the first structure 113A includes germanium, copper, chromium, gallium arsenide (GaAs), a group III element, a group IV element, a III-V compound semiconductor, or a combination thereof, and the second structure 1136 includes an inorganic material, such as silicon, e.g. amorphous silicon. Thus, organic material from lifted off overhang structures that disrupt OLED performance would not be left behind. Eliminating the need for a lift-off procedure also increases throughput.

As shown in FIGS. 2A-2D, each OLED sub-pixel 111 includes a cathode 114 disposed over the OLED material 112. The cathode 114 is includes a conductive material such as a metal. The cathode 114 may be formed from chromium, titanium, aluminum, indium tin oxide (ITO), APT, a compound or another suitably conductive material. A local passivation layer 116 is disposed over the OLED material 112, the cathode 114, and at least a portion of the overhang structures 113.

The opening configuration 100A includes sub-pixel circuits 101 surrounding a sensor opening 103. The sub-pixel circuits 101 surrounding the sensor opening 103 are separated from the sensor opening 103 by the overhang grid 110. As shown in FIG. 2A, an overhang structure 113C separates one of the OLED sub-pixels 111, such as the third OLED sub-pixel 111c, from the sensor opening 103. The sensor opening 103 is surrounded by the overhang structure 113A. The sensor opening 103 has the sensor 107 disposed thereunder, either in or under the backplane 102. A global passivation layer 120 is disposed over the sub-pixel circuits 101 and the sensor opening 103. An intermediate layer 118 is disposed between the overhang grid 110, the local passivation layer 116, and the portion backplane 102 of the sensor opening 103. In some embodiments, which may be combined with other embodiments described herein, e.g., FIG. 2A, a secondary layer 119 is disposed between the local passivation layer 116 and the intermediate layer 118 in the OLED sub-pixels 111. In the embodiments, the secondary layer 119 is disposed between the backplane 102 and the intermediate layer 118 (as shown in FIG. 2A) or the PDL material 109A and the intermediate layer 118 (embodiments of FIG. 2D). In other embodiments, which may be combined with other embodiments described herein, e.g., FIG. 2D, a PDL material 109A is disposed between the intermediate layer 118 and the backplane 102 in the sensor opening 103. The PDL material 109A is transparent or semi-transparent. The passivation layer 120 and the intermediate layer 118 are transparent or semi-transparent. Thus, light is the emitted (if the sensor 107 is an emitter), or received by the sensor 107.

Figure 1B:
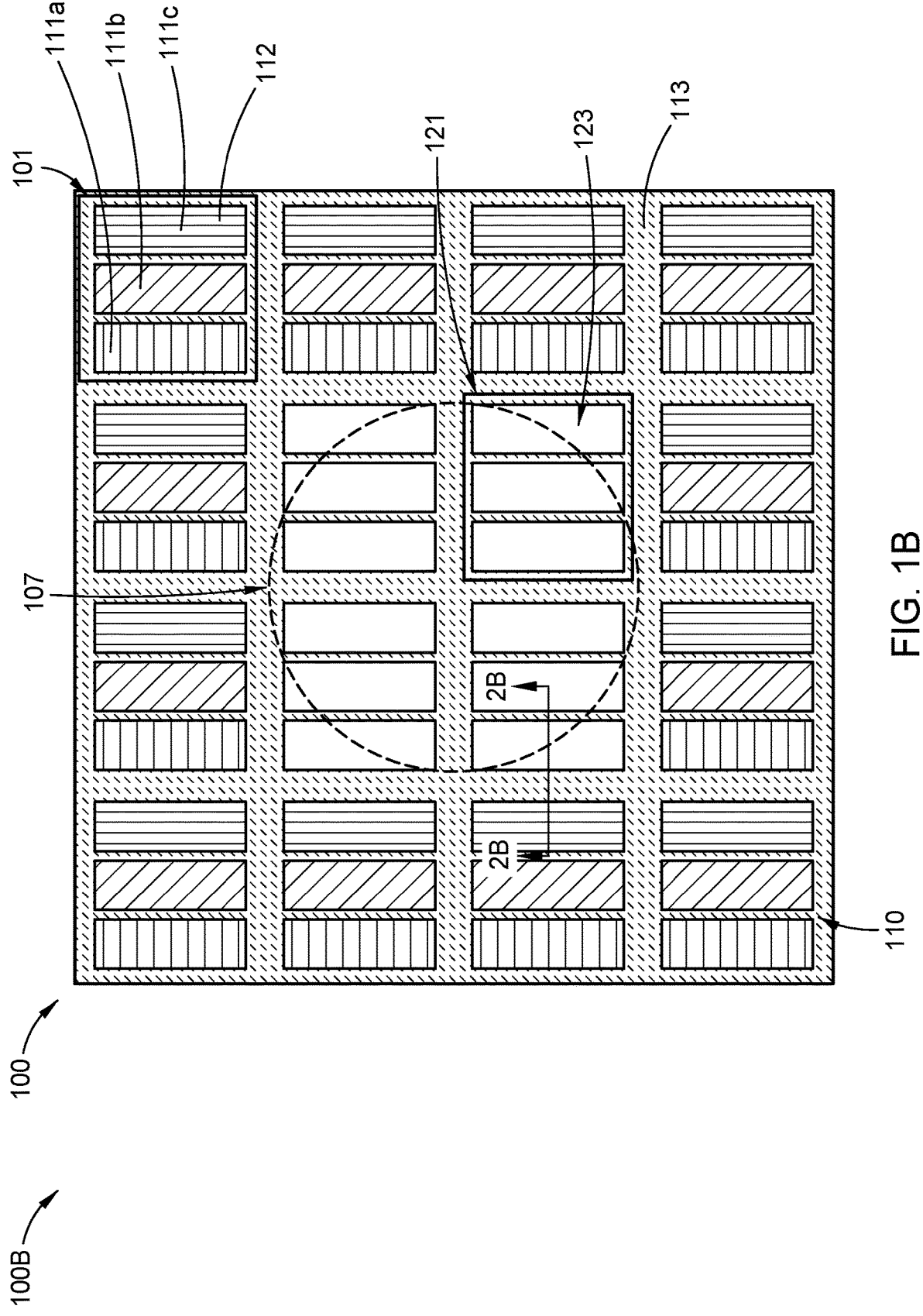
FIG. 1B is a schematic, top sectional view of a display having an array configuration according to embodiments.

FIG. 1B is a schematic, top sectional view of a display 100 having an array configuration 100B. FIG. 2B is a schematic, cross-sectional view of a sub-pixel circuit 101 and a portion of a sensor array 121 of the array configuration 100B. The display 100 of the array configuration 100B includes the plurality sub-pixel circuits 101 and plurality of sensor arrays 121. The sensor opening includes a plurality of sensor arrays 121. Exterior sensor arrays of the plurality of sensor arrays 121 are adjacent to the sub-pixel circuits 101. At least one sensor 107 is disposed under the plurality of sensor arrays 121. The sensor 107 is disposed in or under the backplane 102.

The display 100 having the array configuration 100B includes sub-pixel circuits 101 separated by the overhang grid 110. Exterior sensor arrays adjacent to the sub-pixel circuits 101 are separated from the sub-pixel circuits 101 by the overhang grid 110. Each sub-pixel circuit 101 has a plurality of OLED sub-pixels 111. Each OLED sub-pixel 111 is surrounded by overhang structures 113 of the overhang grid 110. Each OLED sub-pixel 111 has OLED material 112 configured to emit a white, red, green, blue or other color light when energized. Each sensor array 121 has a plurality of sub-pixel openings 123. Each sub-pixel opening 123 is surrounded by overhang structures 113 of the overhang grid 110. As shown in FIG. 2B, an overhang structure 113C separates one of the OLED sub-pixels 111, such as the third OLED sub-pixel 111c, from an exterior sensor array. Each sub-pixel opening 123 have a portion of the sensor 107 disposed thereunder, either in or under the backplane 102. The global passivation layer 120 is disposed over the sub-pixel circuits 101 and the plurality of sensor arrays 121. An intermediate layer 118 is disposed between the overhang grid 110, the local passivation layer 116, and the portion backplane 102 of sub-pixel openings 123. In some embodiments, which may be combined with other embodiments described herein, e.g., FIG. 2D, a PDL material 109A is disposed between the intermediate layer 118 and the backplane 102 in the sub-pixel opening 123. The PDL material 109A is transparent or semi-transparent. The passivation layer 120 and the intermediate layer 118 are transparent or semi-transparent. Thus, light is emitted (if the sensor 107 is an emitter), or received by the sensor 107.

Figure 1C:
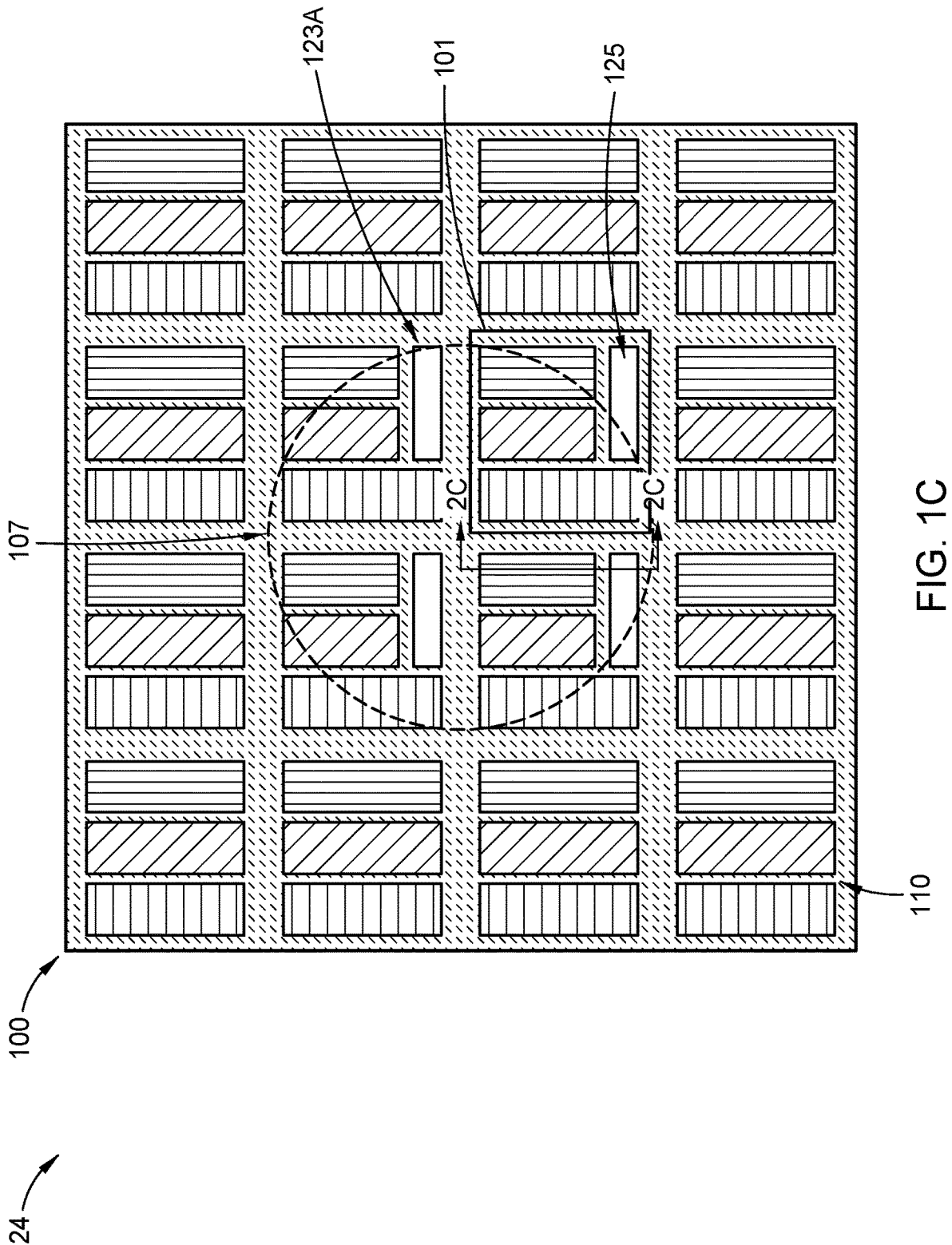
FIGS. 1C and 1D are schematic, top sectional views of a display having a transparent sub-pixel configuration according to embodiments.
Figure 1D:
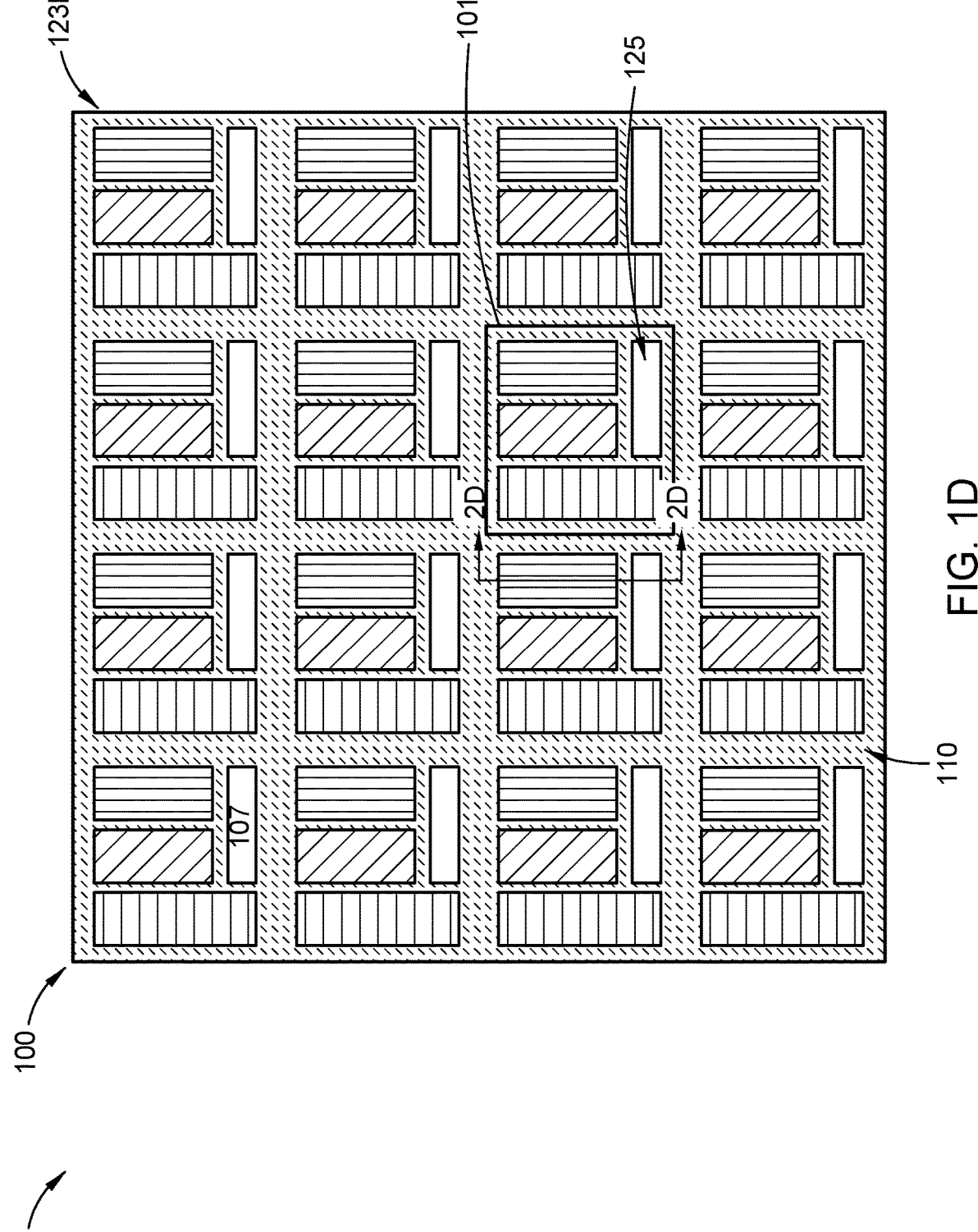

FIGS. 1C and 1D are schematic, top sectional views of a display 100 having a transparent sub-pixel configuration 124. FIGS. 2C and 2D are schematic, cross-sectional views of a sub-pixel circuit 101.

The display 100 of the transparent sub-pixel configuration 124 includes a plurality of sub-pixel circuits 101 separated by the overhang grid 110. Each sub-pixel circuit 101 has a plurality of OLED sub-pixels 111. In some embodiments of the display 100, which may be combined with other embodiments described herein, with the transparent sub-pixel configuration 124, as show in FIG. 1C, includes a portion 123A of the sub-pixel circuits 101 that include the OLED sub-pixels 111 and a transparent sub-pixel 125. The portion 123 of the sub-pixel circuits 101 include at least one sensor 107 disposed thereunder. The sensor 107 is disposed in or under the backplane 102. The transparent sub-pixels 125 of the sub-pixels 101 of the portion 123A are transparent such that light is emitted (if the sensor 107 is an emitter), or received by the sensor 107 through the transparent sub-pixels 125. In the embodiments of FIG. 1D, which may be combined with other embodiments described herein, one or more sensors 107 are disposed in or under the backplane 102 of the display area 123B of the display 100. The display area 123B may be the entire visible area of the display 100. In other embodiments of the display 100 with the transparent sub-pixel configuration 124 of FIG. 1D, one or more sensors 107 are not disposed in or under the backplane 102. The transparent sub-pixel 125 in embodiments without the one or more sensors have an increased transmittance. The transparent sub-pixels 125 of the sub-pixels 101 are transparent such that light is emitted (if the sensor 107 is an emitter), or received by the one or more sensors 107 through the display area 123B of the display 100.

The sub-pixel circuits 101 are separated by an overhang grid 110. Each OLED sub-pixel 111 and transparent sub-pixel 125 are surrounded by overhang structures 113 of the overhang grid 110. Each OLED sub-pixel 111 and transparent sub-pixel 125 are surrounded by overhang structures 113 of the overhang grid 110. In embodiments including PDL structures 109, overhang structures 113 are disposed on an upper surface of each of the PDL structures 109. The overhang structures 113 include at least a second structure 113B disposed over a first structure 113A. Each overhang structure 113 includes an overhang 115. The overhang 115 is defined by an extension 117 of the second structure 113B extending laterally past a sidewall of the first structure 113A. Each OLED sub-pixel 111 includes a cathode 114 disposed over the OLED material 112. A local passivation layer 116 is disposed over the OLED material 112, the cathode 114, and at least a portion of the overhang structures 113 of each OLED sub-pixel 111. The transparent sub-pixel 125 has a portion of the sensor 107 or a respective sensor of a plurality of sensors 107 disposed thereunder, either in (FIG. 2C) or under (FIG. 2D) the backplane 102. A global passivation layer 120 is disposed over the sub-pixel circuits 101 and the sensor opening 103. An intermediate layer 118 is disposed between the overhang grid 110, the local passivation layer 116, and the portion backplane 102 of the sensor opening 103. In some embodiments, which may be combined with other embodiments described herein, e.g., FIG. 2D, the PDL material 109A is disposed between the intermediate layer 118 and the backplane 102 in the transparent sub-pixel 125. The PDL material 109A is transparent or semi-transparent. The passivation layer 120 and the intermediate layer 118 are transparent or semi-transparent.

Figure 3A:
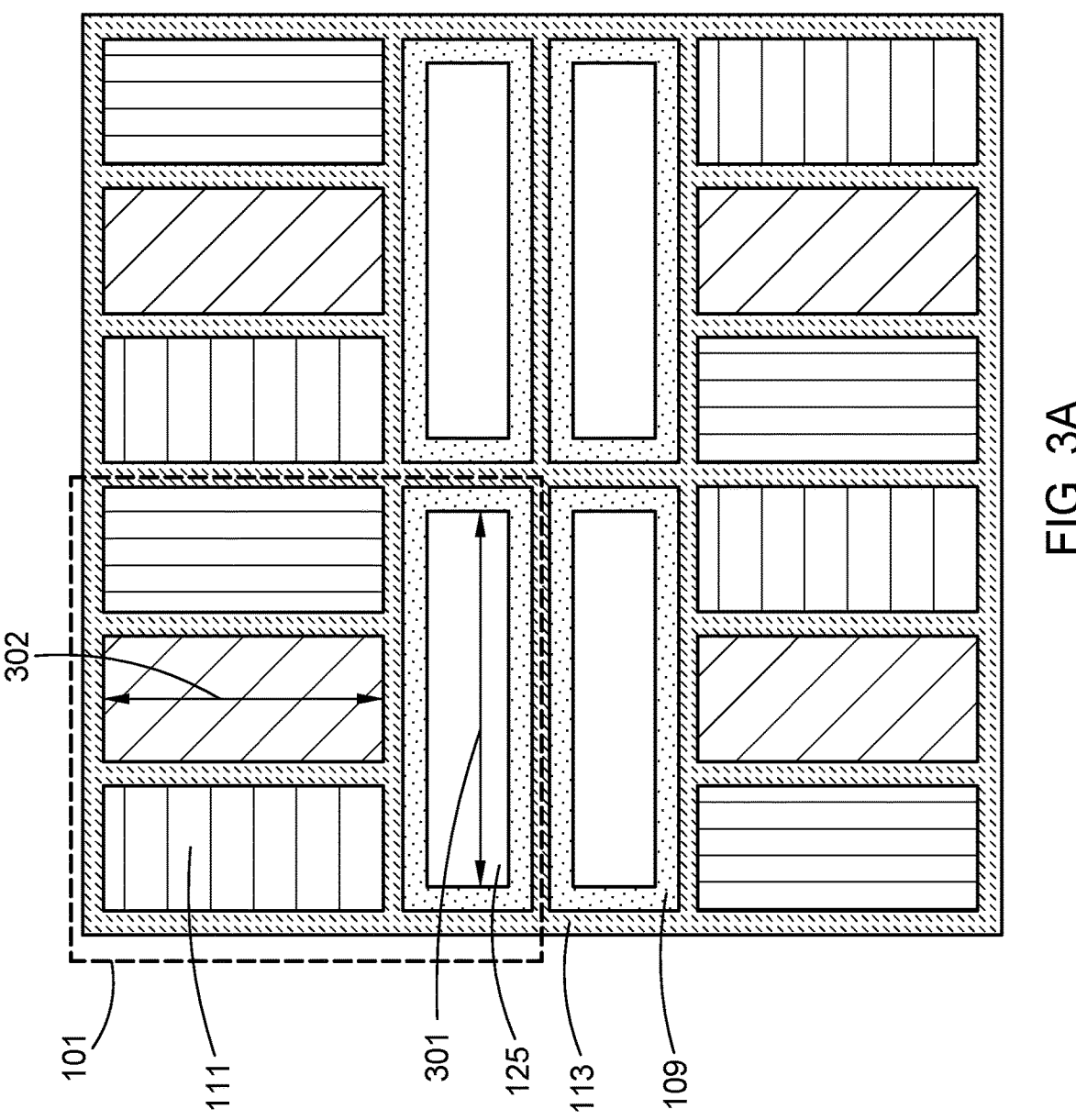
FIGS. 3A-3C are schematic, top sectional views of a transparent sub-pixel configuration according to embodiments.
Figure 3B:
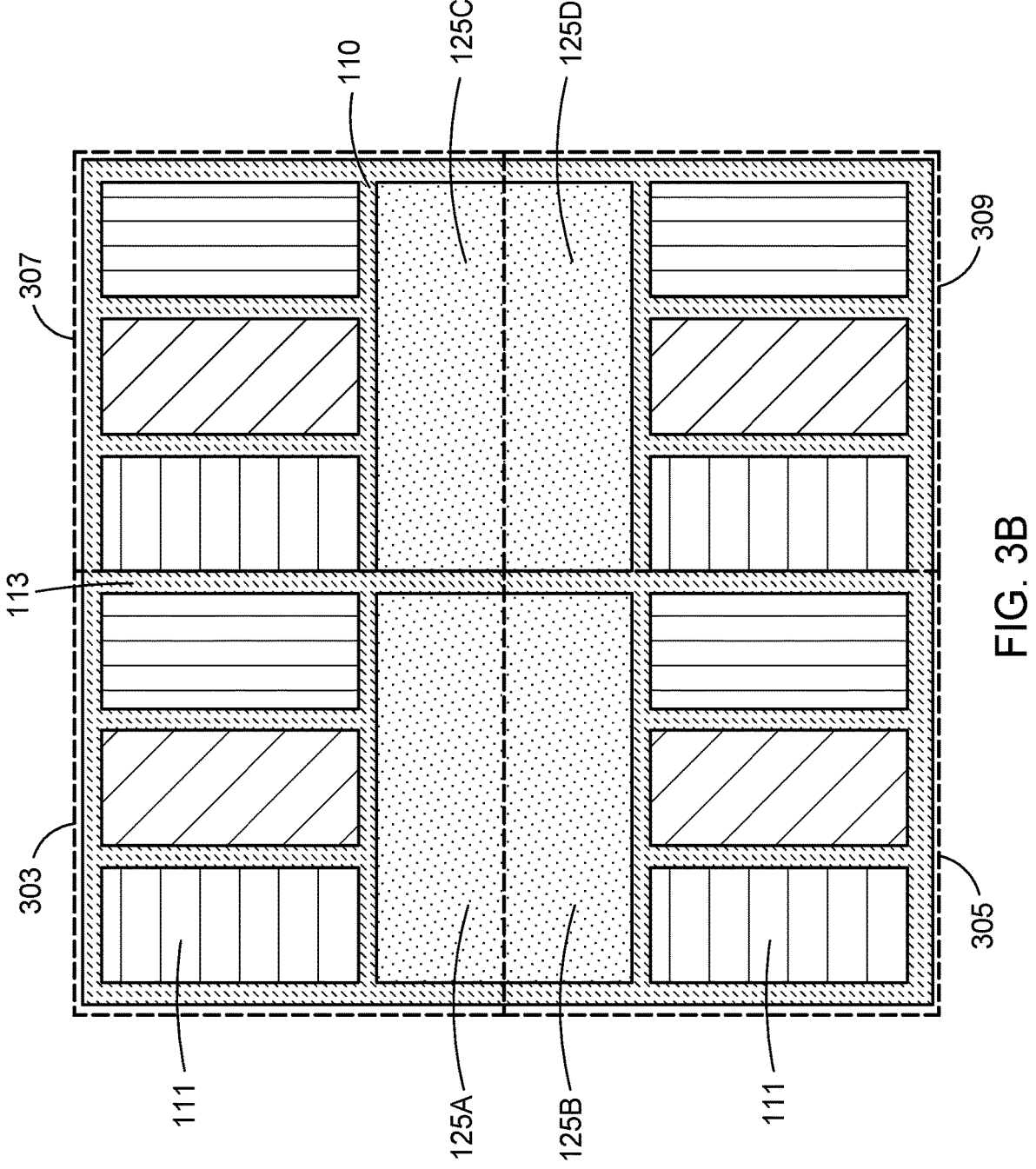
Figure 3C:
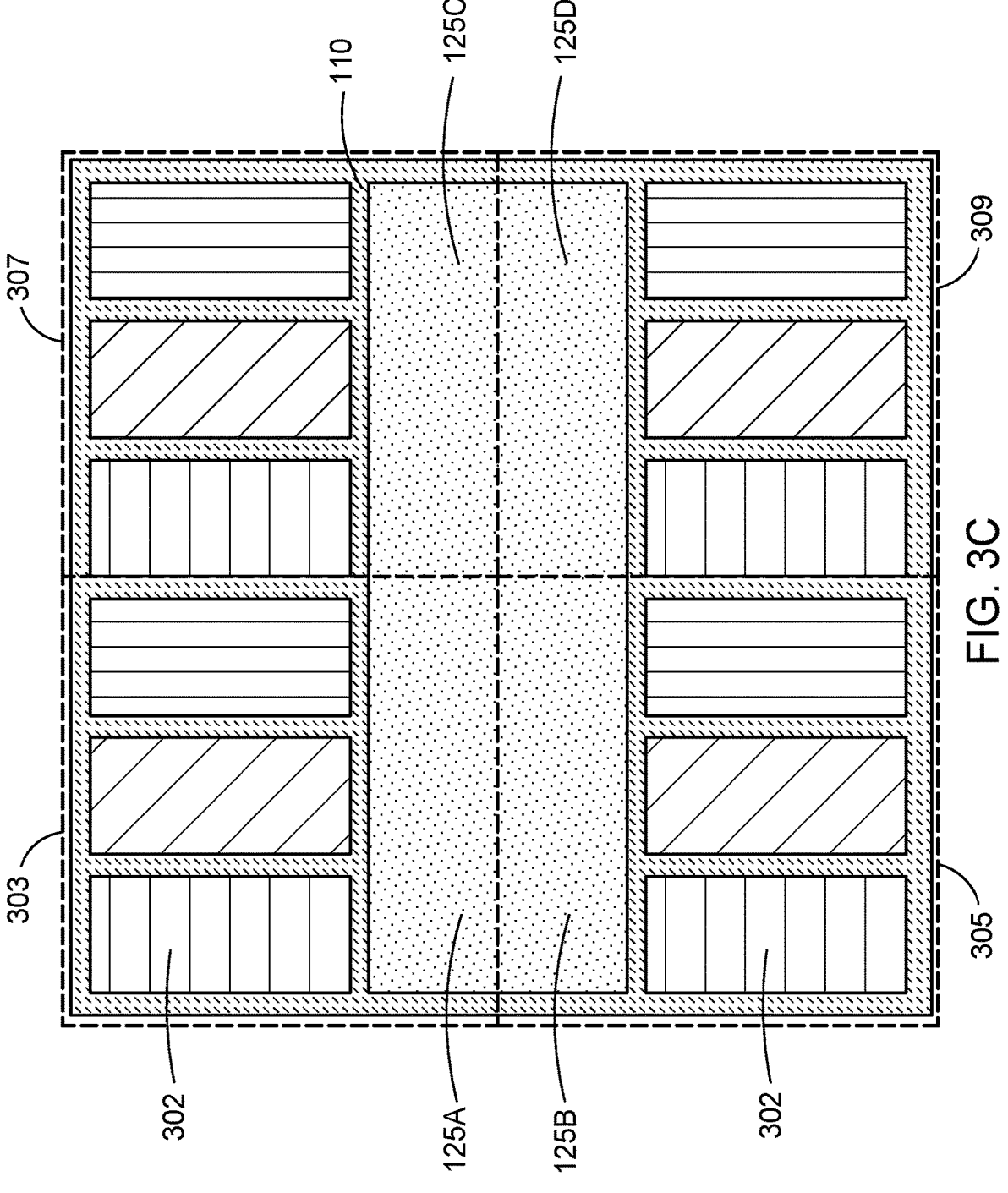

FIGS. 3A-3C are schematic, top sectional views of the transparent sub-pixel configuration 124 of the display 100. As shown in FIG. 3A, each sub-pixel circuit 101 has a transparent sub-pixel 125 that is above or below the OLED sub-pixels 111. The transparent sub-pixel 125 has a width 301 that is the same as a width 302 of all the adjacent OLED sub-pixels 111. As shown in FIGS. 3B and 3C, a first sub-pixel circuit 303 has a first transparent sub-pixel 125A that is below the OLED sub-pixels 111. A second sub-pixel circuit 305 below the first sub-pixel circuit 303 has a second transparent sub-pixel 125B that is above the OLED sub-pixels 111. The first transparent sub-pixel 125A and the second transparent sub-pixel 125B are directly adjacent without an overhang structure 113 therebetween to increase transmittance. In some embodiments, at least one sensor 107 are disposed under the transparent sub-pixels 125. In other embodiments, no sensors 107 are disposed under the transparent sub-pixels 125. As shown in FIG. 3B, a third transparent sub-pixel 125C of a third sub-pixel circuit 307 is adjacent to the first transparent sub-pixel 125A of the first sub-pixel circuit 303 with an overhang structure 113 therebetween, and a fourth transparent sub-pixel 125D of a fourth sub-pixel circuit 309 is adjacent to the second transparent sub-pixel 125B of the second sub-pixel circuit 305 with the overhang structure 113 therebetween. As shown in FIG. 3C, the third transparent sub-pixel 125C of the third sub-pixel circuit 307 is directly adjacent to the first transparent sub-pixel 125A of the first sub-pixel circuit 303 without an overhang structure 113 therebetween, and the fourth transparent sub-pixel 125D of the fourth sub-pixel circuit 309 is adjacent to the second transparent sub-pixel 125B of the second sub-pixel circuit 305 without the overhang structure 113 therebetween to increase transmittance.

Figure 4:
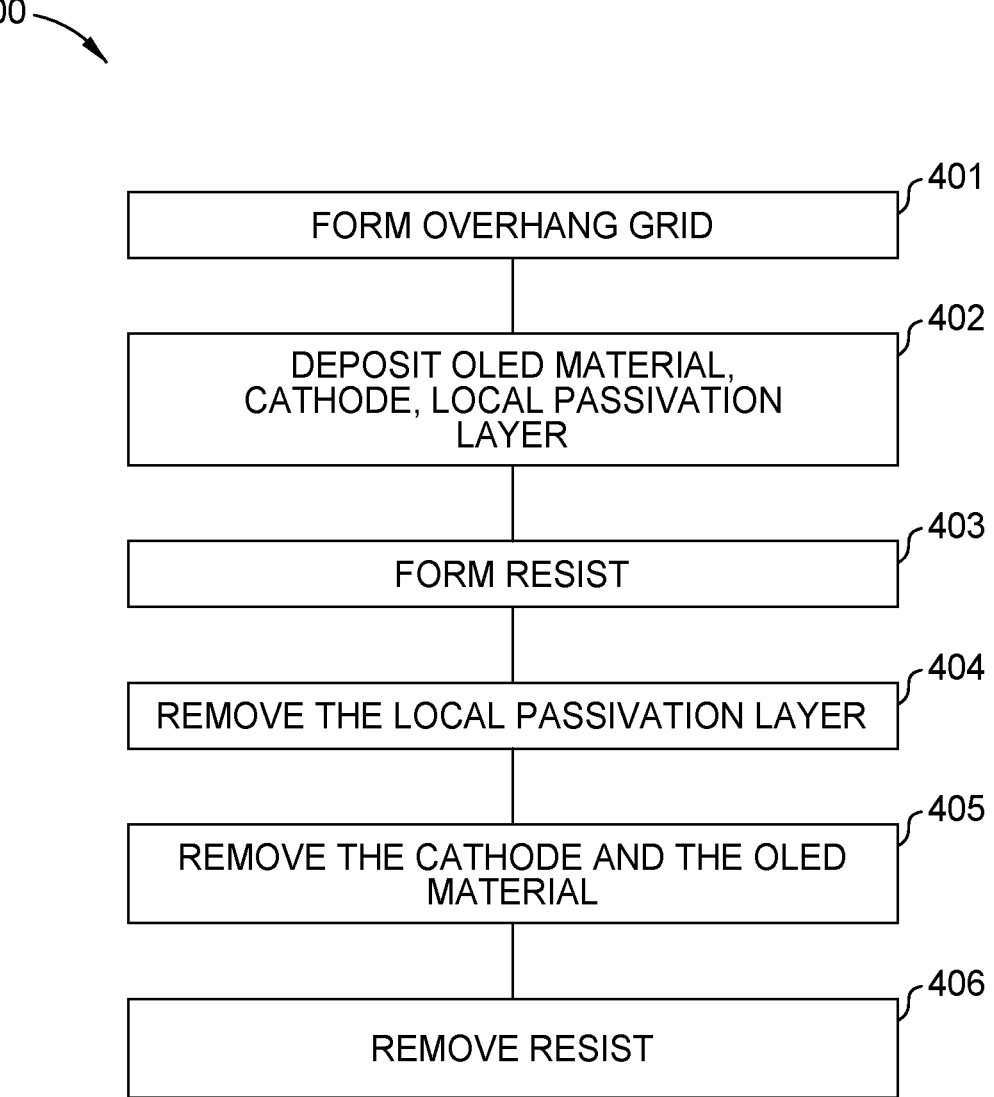
FIG. 4 is a flow diagram of a method for forming display according to embodiments.

FIG. 4 is a flow diagram of a method 400 for forming display 100. Figures are schematic, cross-sectional views of a backplane 100 during the method 400 for forming the display 100 having the opening configuration 100A. FIGS. 6A-6E are schematic, cross-sectional views of a backplane 100 during the method 400 for forming the display 100 having the array configuration 100B or the transparent sub-pixel configuration 124.

8

Figures 5A, 5B:
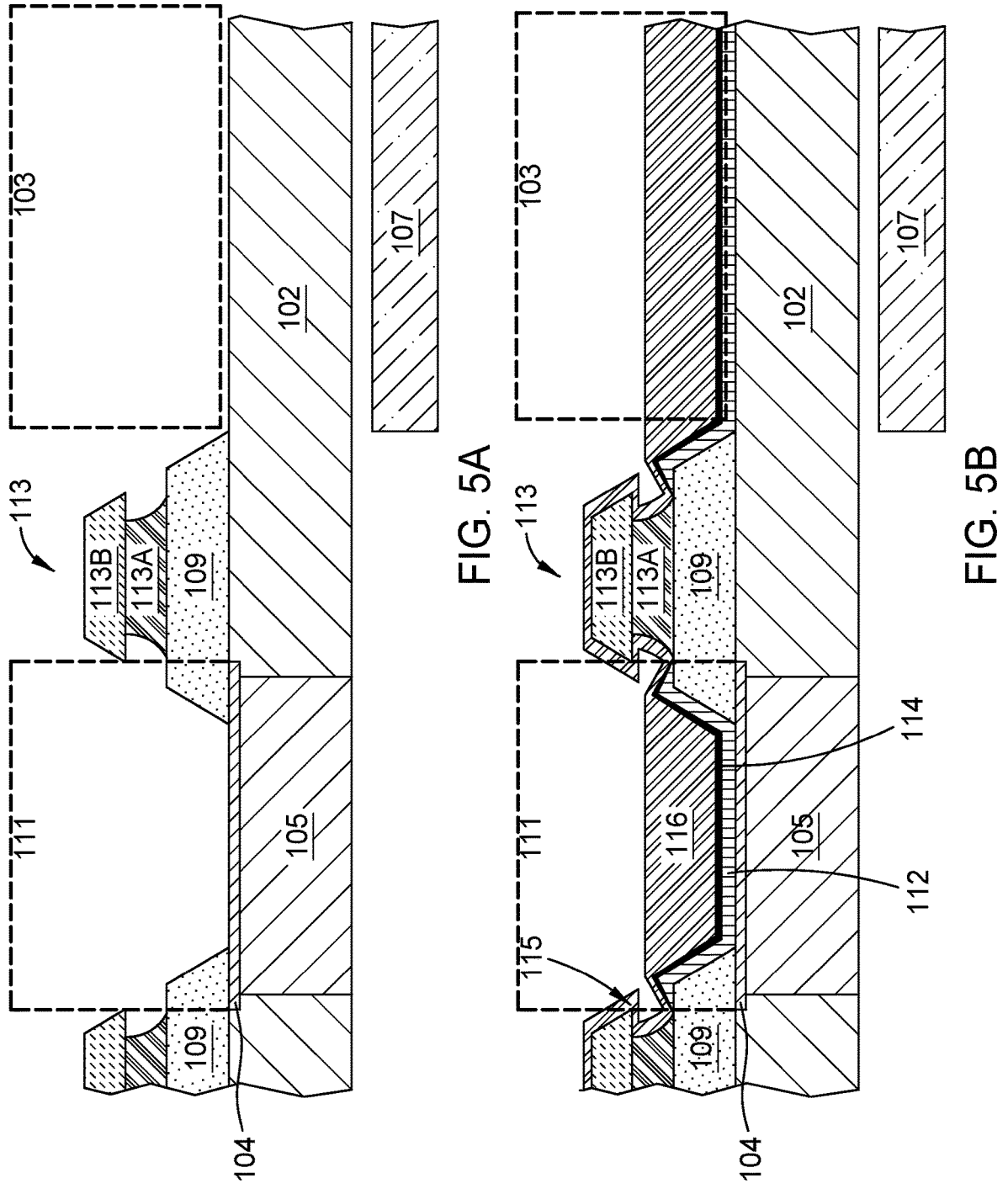
FIGS. 5A-5E are schematic, cross-sectional views of a backplane 100 during the method 400 for forming the display having an opening configuration according to embodiments.
Figures 5C, 5D:
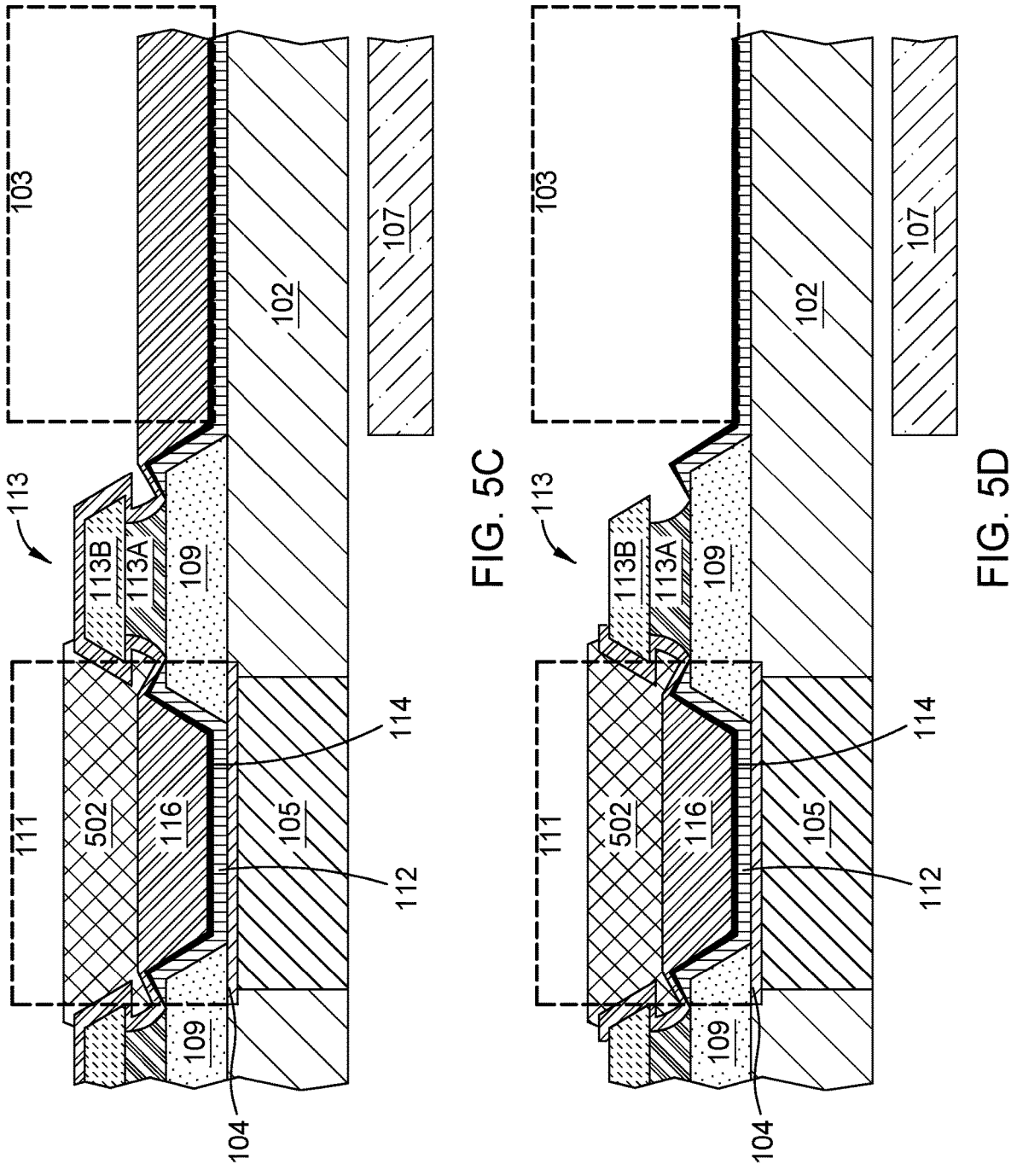
Figures 5E, 6A:
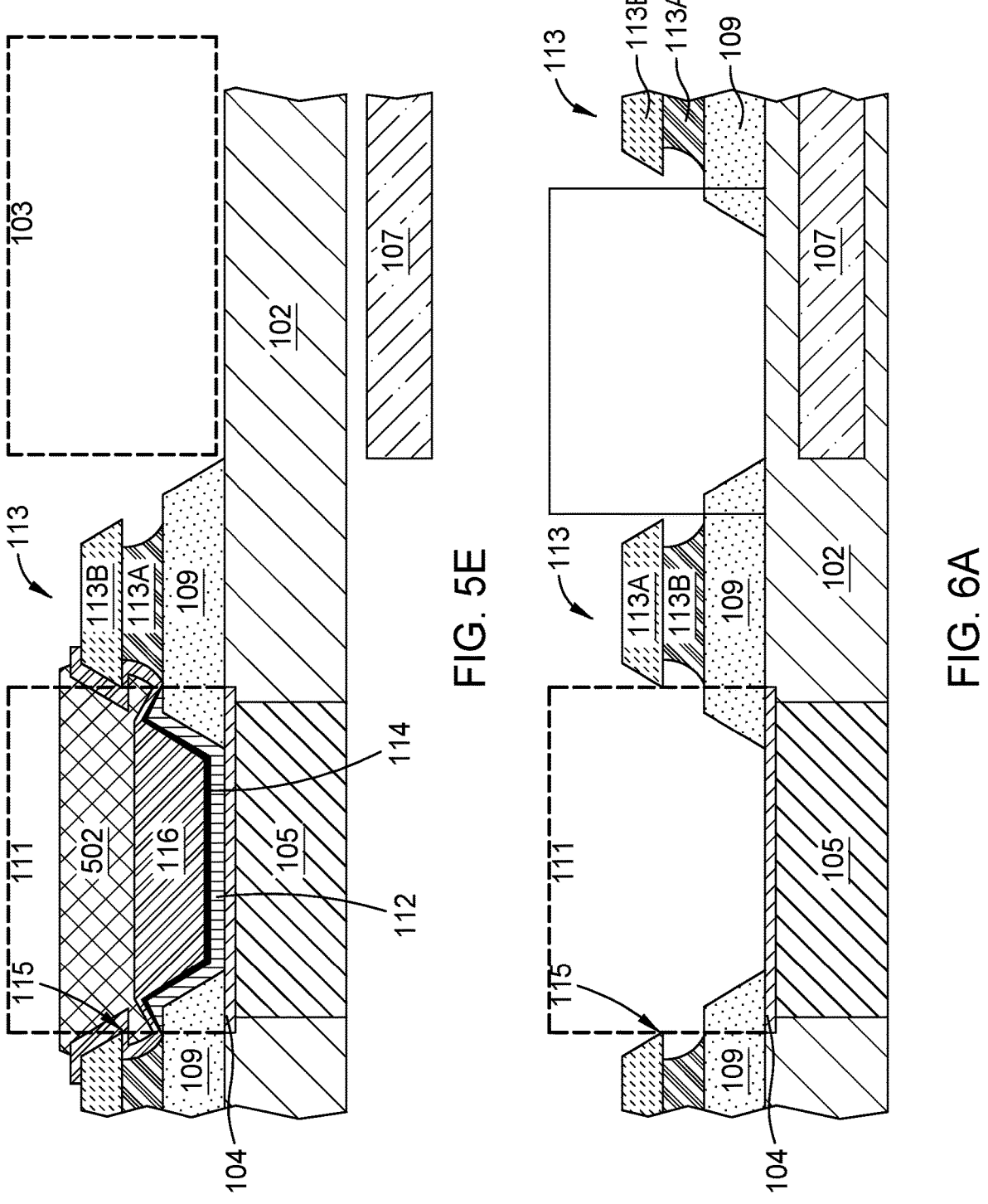
FIGS. 6A-6E are schematic, cross-sectional views of a backplane during a method for forming a display having an array configuration or a transparent sub-pixel configuration according to embodiments.
Figures 6B, 6C:
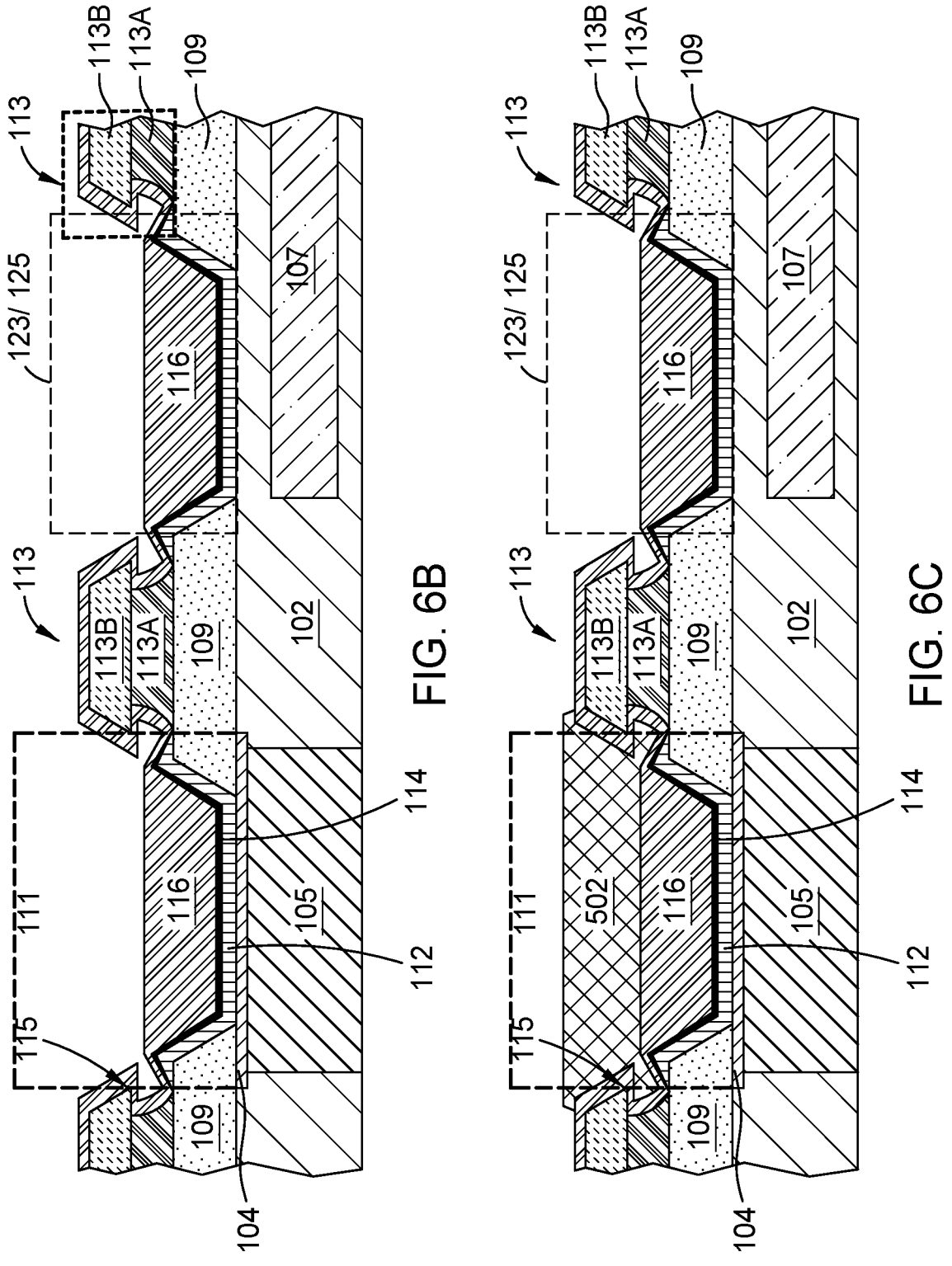
Figures 6D, 6E:
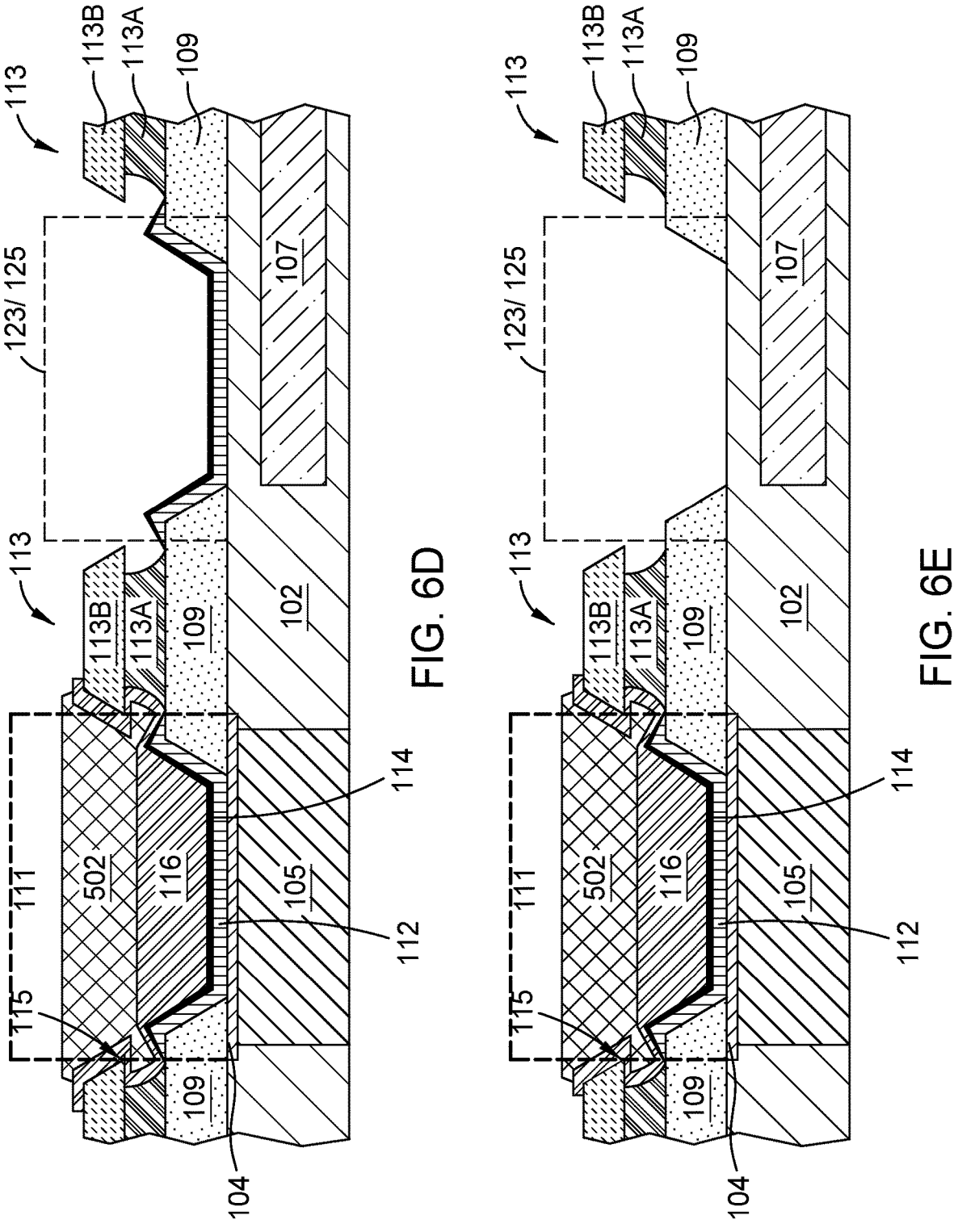

At operation 401, as shown in FIGS. 5A and 6A, the overhang grid 110 is formed. The overhang grid 110 of the embodiments of the display 100 is described herein. At operation 402, as shown in FIGS. 5B and 6B, the OLED material 112, the cathode 114, and the local passivation layer 116 are deposited. At operation 403, as shown in FIGS. 5C and 6C, a resist 502 is formed in the sub-pixel 111. At operation 404, as shown in FIGS. 5D and 6D, the local passivation layer 116 is removed. At operation 405, as shown in FIGS. 5E and 6E, the cathode 114, and the OLED material 112 exposed by the resist 502 are removed. At operation 406, as shown in FIGS. 2A-2D, the resist 502 is removed.

In summation, displays described herein, include the sub-pixel circuits and at least one sensor opening adjacent to the overhang structure and an adjacent sub-pixel circuit. The at least one sensor opening includes a sensor disposed thereunder. Other configurations displays described herein, include sub-pixel circuits including OLED sub-pixels and a transparent sub-pixel such that a sensor is disposed thereunder. The configurations described herein utilize sensors that are integrated to increase the transmittance of the display while eliminating the need for bezels and reducing dead zones in the display.

While the foregoing is directed to embodiments of the present disclosure, other and further embodiments of the disclosure may be devised without departing from the basic scope thereof, and the scope thereof is determined by the claims that follow.

What is claimed is:

1. A display, comprising:
a backplane;
a plurality of sub-pixel circuits separated by an overhang grid disposed over the backplane, each sub-pixel circuit having sub-pixels surrounded by overhang structures of the overhang grid; each sub-pixel having:
an anode connected to a thin film transistor (TFT) of the backplane; and
an organic light-emitting diode (OLED) material disposed over the anode; and
a sensor opening, wherein:
sub-pixel circuits surround the sensor opening and are separated from the sensor opening by the overhang grid;
the sensor opening is surrounded by a respective overhang structure; and
a sensor is disposed under the sensor opening either in or under the backplane.

2. The display of claim 1, wherein an intermediate layer is disposed over the backplane in sensor opening.

3. The display of claim 1, wherein the overhang grid includes a plurality of overhang structures.

4. The display of claim 3, where each over overhang structure is defined by an extension of a second structure extending laterally past a first structure.

5. The display of claim 1, wherein the sensor is a complementary metal oxide semiconductor (CMOS), a charge coupled device (CCD), a metasurface, photodiode, or solar cell.

6. The display of claim 1, wherein the sensor is an emitter.

7. The display of claim 6, wherein the emitter is an IR emitter or a light-emitting diode (LED).

8. The display of claim 1, wherein a layer of pixel defining layer material is disposed on the backplane in the sensor opening.

9. The display of claim 1, wherein the anode is disposed over the TFT.

10. The display of claim 1, wherein the anode is connected to the TFT via wiring.

11. A display, comprising:

a backplane;

a plurality of sub-pixel circuits separated by an overhang grid disposed over the backplane, each sub-pixel circuit having sub-pixels surrounded by overhang structures of the overhang grid; each sub-pixel having:

an anode connected to a thin film transistor (TFT) of the backplane; and an organic light-emitting diode (OLED) material disposed over the anode;

a plurality of sensor arrays, exterior sensor arrays of the plurality of sensor arrays are adjacent to and separated from the sub-pixel circuits by the overhang grid, each sensor array having sub-pixel openings surrounded by overhang structures of the overhang grid; and a sensor is disposed under the plurality of sensor arrays either in or under the backplane.

12. The display of claim 11, wherein the overhang grid includes a plurality of overhang structures.

13. The display of claim 12, where each over overhang structure is defined by an extension of a second structure extending laterally past a first structure.

14. The display of claim 11, wherein the sensor is a complementary metal oxide semiconductor (CMOS), a charge coupled device (CCD), a metasurface, photodiode, or solar cell.

15. The display of claim 11, wherein the sensor is an emitter.

16. The display of claim 15, wherein the emitter is an IR emitter or a light-emitting diode (LED).

17. The display of claim 11, wherein the anode is disposed over the TFT.

18. The display of claim 11, wherein the anode is connected to the TFT via wiring.

19. A sub-pixel circuit, comprising:

a backplane; and an overhang grid disposed on the backplane, the overhang grid defining an organic light-emitting diode (OLED) sub-pixel and a transparent sub-pixel, each of the OLED sub-pixel and the transparent sub-pixel are surrounded by overhang structures of the overhang grid; wherein:

the OLED sub-pixel has:

an anode connected to a thin film transistor (TFT) of the backplane; and an OLED material disposed over the anode.

20. The sub-pixel circuit of claim 19, wherein the overhang grid includes a plurality of overhang structures.

21. The sub-pixel circuit of claim 20, where each over overhang structure is defined by an extension of a second structure extending laterally past a first structure.

22. The sub-pixel circuit of claim 21, wherein the sensor is a complementary metal oxide semiconductor (CMOS), a charge coupled device (CCD), a metasurface, photodiode, or solar cell.

23. The sub-pixel circuit of claim 19, wherein the sensor is an emitter.

24. The sub-pixel circuit of claim 23, wherein the emitter is an IR emitter or a light-emitting diode (LED).

25. The sub-pixel circuit of claim 19, wherein the anode is disposed over the TFT or the anode is connected to the TFT via wiring.

26. The sub-pixel circuit of claim 19, wherein the transparent sub-pixel has a sensor disposed thereunder either in or under the backplane.

27. A method, comprising: depositing an organic light emitting diode (OLED) material over a backplane, wherein an overhang grid defines a sub-pixel area and a transparent area;

disposing a cathode over the OLED material over the sub-pixel area and the transparent area;

depositing an encapsulation layer over the backplane; forming a resist layer in the sub-pixel area of the backplane; removing one or more exposed portions of the encapsulation layer;

removing one or more exposed portions of the OLED material; and removing the resist layer.

28. The method of claim 27, wherein an anode is connected to a thin film transistor (TFT) of the backplane.

29. The method of claim 27, wherein the transparent sub-pixel has a sensor disposed thereunder either in or under the backplane.

30. A device comprising a backplane, and a plurality of overhang structures, wherein adjacent overhang structures of the plurality of overhang structures define at least one sub-pixel and at least one transparent area, wherein the device is made by a process comprising the steps of:

depositing an OLED material over the backplane, the OLED material is disposed over an anode of the at least one sub-pixel; and depositing a cathode, the cathode disposed over the OLED material of at least one sub-pixel, wherein a sensor or an emitter of the at least one transparent area is operable to receive or project light through the backplane and the transparent area.

* * * * *